(12) United States Patent
Choi

(10) Patent No.: US 10,134,813 B2
(45) Date of Patent: Nov. 20, 2018

(54) ORGANIC LIGHT EMITTING DIODE

(71) Applicant: SAMSUNG DISPLAY CO., LTD., Yongin-si, Gyeonggi-do (KR)

(72) Inventor: Sungjin Choi, Hwaseong-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 45 days.

(21) Appl. No.: 15/438,892

(22) Filed: Feb. 22, 2017

(65) Prior Publication Data

US 2017/0243929 A1    Aug. 24, 2017

(30) Foreign Application Priority Data

Feb. 24, 2016 (KR) .......................... 10-2016-0021954

(51) Int. Cl.
*H01L 27/32*  (2006.01)
*H01L 51/50*  (2006.01)
*H01L 51/52*  (2006.01)

(52) U.S. Cl.
CPC ...... *H01L 27/3211* (2013.01); *H01L 51/5044* (2013.01); *H01L 51/5056* (2013.01); *H01L 51/5072* (2013.01); *H01L 51/5088* (2013.01); *H01L 51/5092* (2013.01); *H01L 51/5218* (2013.01); *H01L 51/5234* (2013.01); *H01L 51/5265* (2013.01)

(58) Field of Classification Search
CPC ........ H01L 51/0579; H01L 51/5262–51/5284; H01L 27/3202; H01L 27/3204; H01L 27/3225–27/3234; H01L 27/3209; H01L 27/3244–27/3279; H01L 51/5072–51/05; G02F 2001/136218; G02F 1/136286–2001/136295; F21K 9/00–9/278
See application file for complete search history.

(56) References Cited

U.S. PATENT DOCUMENTS

2012/0161111 A1* 6/2012 Chiang ............... H01L 27/3209
                                                           257/40
2014/0183496 A1* 7/2014 Heo .................... H01L 27/3209
                                                           257/40

FOREIGN PATENT DOCUMENTS

KR       10-1462538 B1    11/2014
KR       10-1511552 B1     4/2015

* cited by examiner

*Primary Examiner* — Julio J Maldonado
*Assistant Examiner* — Stanetta Isaac
(74) *Attorney, Agent, or Firm* — Lee & Morse, P.C.

(57) ABSTRACT

Provided is an organic light emitting diode including a first electrode layer, a second electrode layer opposing the first electrode layer, a first light emitting layer between the first and second electrode layers to generate a first light having a first wavelength, a second light emitting layer between the first light emitting layer and the second electrode layer to generate a second light having a second wavelength which is longer than the first wavelength, and a charge generating layer between the first and second light emitting layers. The first and second lights are emitted through the second electrode layer. An optical length between the first and second electrode layers is substantially the same as a fourth resonant distance of the first light.

18 Claims, 8 Drawing Sheets

ORGANIC LIGHT EMITTING DIODE

CROSS-REFERENCE TO RELATED APPLICATION

Korean Patent Application No. 10-2016-0021954, filed on Feb. 24, 2016, in the Korean Intellectual Property Office, and entitled: "Organic Light Emitting Diode," is incorporated by reference herein in its entirety.

BACKGROUND

1. Field

The present disclosure herein relates to an organic light emitting diode and more particularly to a white organic light emitting diode.

2. Description of the Related Art

Organic light emitting diodes have rapid response rate, are driven at low voltage, and are self-luminescent type. Therefore, organic light emitting displays including the organic light emitting diodes may not include a separate light source which leads to various benefits such as allowing of light and thin shape, excellent brightness, and independence from viewing angle.

The organic light emitting diode is a display diode including a light emitting layer having organic materials between anode and cathode electrodes. Holes provided from the anode electrode and electrons provided from the cathode electrode are coupled in the light emitting layer to form excitons and then produce light corresponding to the energy between holes and electrons from the excitons.

SUMMARY

An embodiment provides an organic light emitting diode including a first electrode layer, a second electrode layer opposing the first electrode layer, a first light emitting layer between the first and second electrode layers to generate a first light having a first wavelength, a second light emitting layer between the first light emitting layer and the second electrode layer to generate a second light having a second wavelength which is longer than the first wavelength, and a charge generating layer between the first and second light emitting layers. The first and second lights are emitted through the second electrode layer. An optical length between the first and second electrode layers is a fourth resonant distance of the first light.

In an embodiment, the first electrode layer may a reflective electrode layer, and the second electrode may be transflective electrode layer.

In an embodiment, the first electrode layer may include a top surface directed to the second electrode layer and a bottom surface opposite to the top surface; the second electrode layer may include a bottom surface directed to the first electrode layer and a top surface opposite to the bottom surface; and the optical length between the first and second electrode layers may be a minimal length from the top surface of the first electrode layer to the bottom surface of the second electrode layer.

In an embodiment, the fourth resonant distance of the first light may be between about 4000 Å to about 4400 Å.

In an embodiment, the second and first light may be mixed to generate light having white color.

In an embodiment, the first wavelength may be in the range of about 450 nm to about 595 nm, and the second wavelength may be in the range of about 570 nm to about 590 nm.

In an embodiment, the red dopant doping concentration of the second light emitting layer may be about 4% or more.

In an embodiment, the optical length between the second light emitting layer and the first electrode layer may substantially be the same as a second resonant distance or third resonant distance of the second light.

In an embodiment, the optical length between the second light emitting layer and the first electrode layer may be defined as a distance from the first electrode layer to the light emitting center of the second light emitting layer, and the light emitting center may be defined at a location spaced apart from the surface of the second light emitting layer by ½ of the thickness of the second light emitting layer.

In an embodiment, the second light emitting layer may include a first sub light emitting layer generating a third light having a third wavelength; and a second sub light emitting layer laminated on the first sub light emitting layer and generating a fourth light having a fourth wavelength different from the third wavelength, wherein the third and fourth light may be mixed to generate the second light.

In an embodiment, wherein the light emitting center of the second light emitting layer may be defined at the interface between the first and second sub light emitting layers.

In an embodiment, the third wavelength is in the range from about 620 nm to about 750 nm and the fourth wavelength is in the range from about 495 nm to about 570 nm.

In an embodiment, the optical length between the second light emitting layer and the first electrode layer may substantially be the same as a second resonant distance or third resonant distance of the fourth light.

In an embodiment, the second resonant distance of the fourth light may be about 1700 Å to about 2100 Å, and the third resonant distance of the fourth light may be about 3100 Å to about 3600 Å.

In an embodiment, the organic light emitting diode may further includes a third light emitting layer between the first and second light emitting layers, wherein the charge generating layer may be provided in plural to include the first and second charge generating layers, the first charge generating layer may be between the first and third light emitting layers, and the second charge generating layer may be between the second and third light emitting layers.

In an embodiment, the third light emitting layer may generate a fifth light having a wavelength of about 450 nm to about 595 nm.

In an embodiment, the optical length between the first light emitting layer and the first electrode layer may substantially be the same as a second resonant distance of the first light.

In an embodiment, the light emitting center of the first light emitting layer may be spaced apart from the first electrode layer by about 1300 Å to about 1700 Å

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
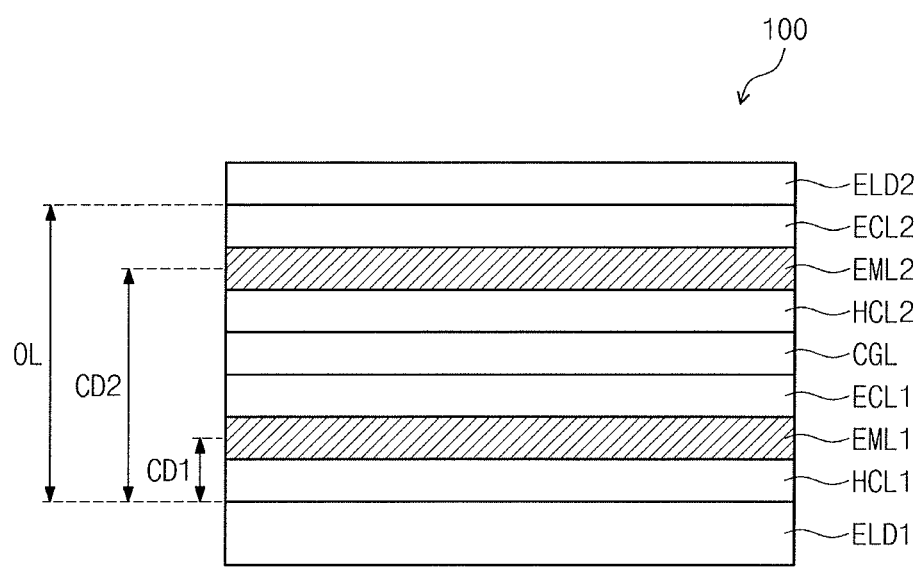
FIG. 1 illustrates a cross sectional view schematically showing an organic light emitting diode according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 is a cross sectional view schematically showing an organic light emitting diode according to an embodiment. As shown in FIG. 1, an organic light emitting diode 100 may include a first electrode layer ELD1, a second electrode layer ELD2, a plurality of light emitting layers EML1, EML2, a charge generating layer CGL, a plurality of hole control layers HCL1, HCL2 and a plurality of electron control layers ECL1, ECL2.

The first electrode layer ELD1 may be a pixel electrode layer or anode electrode layer. The first electrode layer ELD1 may include a material having a high work function to facilitate hole injection. The first electrode layer ELD1 includes a conductive material.

The first electrode layer ELD1 may be a reflective electrode layer. For examples, the first electrode layer ELD1 may include at least any one of magnesium (Mg), aluminum (Al), silver (Ag), platinum (Pt), palladium (Pd), aurum (Au), nickel (Ni), neodymium (Nd), iridium (Ir), chrome (Cr), or a mixture thereof, that have high reflectivity.

The first electrode layer ELD1 may be a monolayer or multilayer. For example, the first electrode layer ELD1 may have a monolayer structure including silver or a metal mixture of indium tin oxide (ITO), bilayer structure of ITO/Mg or ITO/MgF, or tertiary layer structure of ITO/Ag/ITO.

The first electrode layer ELD1 may be transflective electrode layer or transmissive electrode layer. For example, the first electrode layer ELD1 may include at least any one of transparent conductive oxide (TCO), e.g., indium tin oxide (ITO), indium zinc oxide (IZO), tin dioxide ($SnO_2$), and zinc oxide (ZnO). However, the first electrode layer ELD1 is not limited to any particular material.

The second electrode layer ELD2 is on the first electrode layer ELD1, e.g., the second electrode layer ELD2 opposes the first electrode layer ELD1. The second electrode layer ELD2 may be a common electrode layer or cathode electrode layer.

The second electrode layer ELD2 is opposite to the first electrode layer ELD1. For example, when the first electrode layer ELD1 is an anode electrode layer, the second electrode layer ELD2 may be a cathode electrode layer. Therefore, the second electrode layer ELD2 may include a material having low work function to facilitate electron injection.

The second electrode layer ELD2 may be a reflective, transflective or transmissive electrode layer. The second electrode layer ELD2 is not limited to any one embodiment, but may include various materials depending on the structure of the organic light emitting diode 100.

The second electrode layer ELD2 includes a conductive material. The conductive material may be a metal, alloy, electrical conductive compound, and a mixture thereof. For example, the second electrode layer ELD2 may include at least any one of reflective materials consisting of lithium (Li), magnesium (Mg), aluminum (Al), aluminum-lithium (Al—Li), calcium (Ca), magnesium-indium (Mg—In), and magnesium-silver (Mg—Ag). Otherwise, the second electrode layer ELD2 may include a TCO, e.g., ITO, IZO, ZnO and indium tin zinc oxide.

The second electrode layer ELD2 may be a monolayer or multilayer. The multilayer may include at least any one of layer including reflective materials or layer including transmissive materials.

The plurality of light emitting layers EML1, EML2 are between the first electrode layer ELD1 and the second electrode layer ELD2. Each of the light emitting layers EML1, EML2 includes a host material and a dopant material. Each of the light emitting layers EML1, EML2 may be formed by using a phosphorescent or fluorescent material as a dopant in a host material. The color of light emitted by these layers may be determined by a combination of the host material and the dopant material.

Examples of the host material may include, without particular limitation, typically used material, e.g., tris(8-hydroxyquinolino)aluminum (Alq3), 4,4'-bis(N-carbazolyl)-1,1'-biphenyl (CBP), poly(n-vinylcabazole) (PVK), 9,10-di(naphthalene-2-yl)anthracene (ADN), 4,4',4"-tris (carbazol-9-yl)-triphenylamine (TCTA), 1,3,5-tris(N-phenylbenzimidazole-2-yl)benzene (TPBi), 3-tert-butyl-9,10-di (naphth-2-yl)anthracene (TBADN), distyrylarylene (DSA), 4,4'-bis(9-carbazolyl)-2,2'-dimethyl-biphenyl (CDBP), and 2-methyl-9,10-bis(naphthalen-2-yl)anthracene (MADN).

For example, when the layer emits red light, the layer may include a fluorescent material including PBD:Eu(DBM)3 (Phen)(tris(dibenzoylmethanato)phenanthoroline europium) or perylene. In that case, a dopant material included in the layer may be selected from, e.g., an organometallic complex or a metal complex such as PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP(octaethylporphyrin platinum).

For example, when the layer emits green color, the layer may include a fluorescent material including Alq3(tris(8-hydroxyquinolino)aluminum). In that case, a dopant material included in the layer may be selected from an organometallic complex or a metal complex, e.g., Ir(ppy)3(fac-tris (2-phenylpyridine)iridium).

For example, when the layer emits blue color, the layer may include a fluorescent material including any one of spiro-DPVBi, spiro-6P, distyryl-benzene (DSB), distyryl-arylene (DSA), polyfluorene (PFO)-based polymer and poly (p-phenylene vinylene) (PPV)-based polymer. In that case, the dopant material included in the layer may be selected from, for example, an organometallic complex or metal complex such as (4,6-F2ppy)2Irpic.

The plurality of light emitting layers EML1, EML2 may include a first light emitting layer EML1 and a second light emitting layer EML2 on the first light emitting layer EML2. In the present embodiment, the first light emitting layer EML1 and the second light emitting layer EML2 respectively generate light having different colors.

The first light emitting layer EML1 generates a first light. The first light emitting layer EML1 may be closer to the first electrode layer ELD1 than the second light emitting layer EML2. The first light emitting layer EML1 may generate light having relatively shorter wavelength than that of the second light emitting layer EML2. The first light may be in a range of wavelength of about 450 nm to about 595 nm, e.g., blue light.

The second light emitting layer EML2 generates a second light. The second light emitting layer EML2 may be further from the first electrode layer ELD1 than the first light emitting layer EML1. The second light emitting layer EML2 may generate light having a wavelength relatively longer than that of the first light emitting layer EML1. The second light may be combined with the first light to produce white light. The second light may be in a range of wavelength of about 570 nm to about 590 nm, e.g., yellow light.

However, these features are illustrative, and the first and second light emitting layers EML1, EML2 according to an embodiment may be designed to generate various colors of light and not limited to those above. The first and second light emitting layers EML1, EML2 may be formed through various methods, e.g., a vacuum deposition method, spin coating method, cast method, Langmuir-Blodgett (LB) method, inkjet printing method, laser printing method, and laser induced thermal imaging (LITI) method.

The charge generating layer CGL may be between the first and second light emitting layers EML1, EML2, and increases current efficiency generated by one light emitting layer, e.g., doubles the efficiency. When voltage is applied to the charge generating layer CGL, a redox reaction occurs such that a complex is formed and a charge is generated.

The charge generating layer CGL may include an n-type aryl amine-based material or p-type metal oxide. For example, the charge generating layer CGL may include a charge-generating compound including an aryl amine-based organic compound, a metal, an oxide, carbide, or fluoride of a metal, or a mixture thereof. For example, the aryl amine-based organic compound may be α-NPD, 2-TNATA, TDATA, MTDATA, spiro-TAD, or spiro-NPB. For example, the metal may be cesium (Cs), molybdenum (Mo), vanadium (V), titanium (Ti), tungsten (W), barium (Ba), or lithium (Li). In addition, for example, the oxide, carbide, or fluoride of a metal may be $Re_2O_7$, $MoO_3$, $V_2O_5$, $WO_3$, $TiO_2$, $Cs_2CO_3$, BaF, LiF, or CsF.

The first hole control layer HCL1 is between the first electrode layer ELD1 and the first light emitting layer EML1. The second hole control layer HCL2 is between the charge generating layer CGL and the second light emitting layer EML2.

When the first electrode layer ELD1 is defined as an anode electrode layer, holes injected from the first electrode layer ELD1 reach the first light emitting layer EML1 via the first hole control layer HCL1. Holes generated in the charge generating layer CGL reaches the second light emitting layer EML2 via the second hole control layer HCL2.

Each of the first and second hole control layers HCL1, HCL2 may be divided into at least any one of regions of hole injection region, hole transport region, buffer region, and electron blocking region. Each of the first and second hole control layers HCL1, HCL2 may have a monolayer including a single material, a monolayer including a plurality of different materials, or a multilayer structure including a plurality of layers including a plurality of different materials.

For example, each of the first and second hole control layers HCL1, HCL2 may include at least any one of a hole injection layer corresponding to the hole injection region, a hole transport layer corresponding to the hole transport region, and a monolayer having both hole injection and hole transport functions. Each of the first and second hole control layers HCL1, HCL2 may include at least any one of hole injection material and hole transport material. Each of the hole injection material and hole transport material may be known materials.

Examples of the hole transport material may include a carbazole-based derivative such as N-phenylcarbazole, and polyvinylcarbazole, a fluorine-based derivative, a triphenylamine-based derivative such as N,N'-bis(3-methylphenyl)-N,N'-diphenyl-[1,1-biphenyl]-4,4'-diamine (TPD), and 4,4',4"-tris(N-carbazolyl)triphenylamine (TCTA), N,N'-di (1-naphthyl)-N,N-diphenylbenzidine (NPB), or 4,4'-Cyclohexylidene bis[N,N-bis(4-methylphenyl)benzenamine (TAPC), but are not limited thereto. Examples of the hole injection material may include at least any one of a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4'4"-Tris(N,N-diphenylamino)triphenylamine (TDATA), 4,4',4"-tris{N,-(2-naphthyl)-N-phenylamino}-triphenylamine (2TNATA), poly(3,4-ethylenedioxythiophene)/poly(4-styrenesulfonate) (PEDOT/PSS), (polyaniline/dodecylbenzenesulfonic acid (PANI/DBSA), polyaniline/camphor sulfonicacid (PANI/CSA), and (polyaniline)/poly(4-styrenesulfonate) (PANI/PSS), but are not limited thereto.

Each of the first and second hole control layers HCL1, HCL2 may be formed through a process similar to that of the first and second light emitting layers EML1, EML2. Each of the first and second hole control layers HCL1, HCL2 may be formed through various methods such as a vacuum deposition method, spin coating method, cast method, Langmuir-Blodgett (LB) method, inkjet printing method, laser printing method and laser induced thermal imaging (LITI) method.

Each of the first and second hole control layers HCL1, HCL2 may include a hole blocking layer corresponding to the hole blocking region. In that case, each of the first and second hole control layers HCL1, HCL2 may include a known hole blocking material. In addition, each of the first and second hole control layers HCL1, HCL2 may further include a charge-generating material.

The first electron control layer ECL1 is between the first light emitting layer EML1 and the charge generating layer CGL. Electrons generated in the charge generating layer CGL reach the first light emitting layer EML1 via the first electron control layer ECL1.

The second electron control layer ECL2 is between the second light emitting layer EML2 and the second electrode layer ELD2. When the second electron control layer ECL2 is a cathode electrode layer, electrons injected from the second electrode layer ELD2 reach the second light emitting layer EML2 via the second electron control layer ECL2.

Each of the first and second electron control layers ECL1, ECL2 may be divided into at least any one of regions of an electron injection region, electron transport region, and hole blocking region. Each of the first and second electron control layers ECL1, ECL2 may have a monolayer including a single material, a monolayer including a plurality of different materials, or a multilayer structure including a plurality of layers including a plurality of different materials.

For example, each of the first and second electron control layers ECL1, ECL2 may include at least any one of an electron injection layer corresponding to the electron injection region, an electron transport layer corresponding to the electron transport region, and a monolayer having both electron injection and electron transport functions.

Each of the first and second electron control layers ECL1, ECL2 may include at least any one of an electron transport material and electron injection material. Examples of the electron transport material may include tris(8-hydroxyquinolinato)aluminum (Alq3), 1,3,5-Tri(1-phenyl-1H-benzo[d]imidazol-2-yl)phenyl (TPBi), 2,9-Dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate) (Bebq2), 9,10-di(naphthalene-2-yl)anthracene (ADN) and a mixture thereof, but are not limited thereto.

Examples of the electron injection material may be lanthanum metal, e.g., LiF, lithium quinolate (LiQ), $Li_2O$, BaO, NaCl, CsF, and Yb, a halogenated metal, e.g., RbCl, and RbI, or a mixture of an electron transport material and an insulative organometallic salt, but are not limited thereto. The organometallic salt may be a material having an energy band gap of about 4 eV or more. Specifically, examples of the organometallic salt may include metal acetate, metal benzoate, metal acetoacetate, metal acetylacetonate, or metal stearate.

Each of the first and second electron control layers ECL1, ECL2 may be formed through various methods, e.g., a vacuum deposition method, spin coating method, cast method, Langmuir-Blodgett (LB) method, inkjet printing method, laser printing method, and laser induced thermal imaging (LITI) method.

The organic light emitting diode 100 has a certain first optical length OL. The first optical length OL may be distance in which light generated by the organic light emitting diode 100 is reflected from reflecting interfaces and produces resonance.

The reflecting interfaces may be defined on the surface of the first electrode layer ELD1 and the second electrode layer ELD2. Therefore, the first optical length OL may be defined as a minimal distance from the interface between the first electrode layer ELD1 and the layer in contact to the first electrode layer ELD1 to the interface between the second electrode layer ELD2 and the layer in contact to the second electrode layer ELD2.

In the present embodiment, the first optical length OL may be a distance from a top surface of the first electrode layer ELD1 to a bottom surface of the second electrode layer ELD2, e.g., facing surfaces. The first optical length OL may be determined by a distance from the interface of the first electrode layer ELD1 and the first hole control layer HCL1 to the interface of the second electrode layer ELD2 and the second electron control layer ECL2. However, these features are illustrative, and the contact layer may be various layers and not limited to any one embodiment.

The first optical length OL may be a fourth resonant distance of blue color light. In the present embodiment, the first electrode layer ELD1 may be reflective layer, and the organic light emitting diode 100 may have a top emission structure. In that case, the first optical length OL may be about 4200 Å. For example, the first optical length OL may be about 4000 Å to about 4400 Å.

Certain second optical lengths CD1, CD2, respectively corresponding to the light emitting layers EML1, EML2, may be defined at the organic light emitting diode 100. In the present embodiment, the second optical length may be a color distance. The color distance, which is a distance from the reflective interface to the light emitting center, may be a separation distance of each of the light emitting centers of the light emitting layers EML1, EML2 from the first electrode layer ELD1 when the first electrode layer ELD1 is a reflective electrode layer. The light emitting center may correspond to the center part where light generated from the light emitting layer is emitted.

The second optical lengths CD1, CD2 are defined corresponding to each of the first light emitting layer EML1 and the second light emitting layer EML2. The light emitting center of the first light emitting layer EML1 is spaced apart from the first electrode layer ELD1 by the second optical length CD1 corresponding to the first light emitting layer EML1. And the light emitting center of the second light emitting layer EML2 is spaced apart from the second electrode layer ELD2 by the second optical length CD2 corresponding to the second light emitting layer EML2

For example, the light emitting center of the first light emitting layer EML1 may be positioned at ½ of the thickness of the first light emitting layer EML1. Therefore, the first light emitting layer EML1 may be at a location where the light emitting center of the first light emitting layer EML1 is spaced apart from the first electrode layer ELD1 by the second optical length CD1 corresponding to the first light emitting layer EML1.

The light emitting center of the second light emitting layer EML2 may also be positioned at of ½ of the thickness of the second light emitting layer EML2. Therefore, the second light emitting layer EML2 may be at a location where the light emitting center of the second light emitting layer EML2 is spaced apart from the first electrode layer ELD1 by the second optical length CD2 corresponding to the first light emitting layer EML2.

The second optical distance CD1, CD2 according to an embodiment may be designed to correspond to resonant distances of light emitted from the corresponding light emitting layers. In particular, the second optical length CD1, CD2 may correspond to a second or third resonant distance of the second light.

When the second light emits light having a wavelength of about 580 nm, the second optical length CD1, CD2 may be about 1900 Å to about 3350 Å. For example, the second optical length CD1, CD2 may be about 1700 Å to about 2100 Å or about 3100 Å to about 3600 Å.

According to an embodiment, by controlling the first optical length OL together with the second optical lengths CD1, CD2, light generated by the organic light emitting diode 100 may be prevented from being shifted to a certain color and white light having high purity may be generated. Thus, the organic light emitting diode 100 according to an embodiment may enhance color purity and light efficiency of the organic light emitting diode 100 by controlling the first optical length OL and second optical length CD1, CD2. Detailed description of this will follow.

Figure 2A:
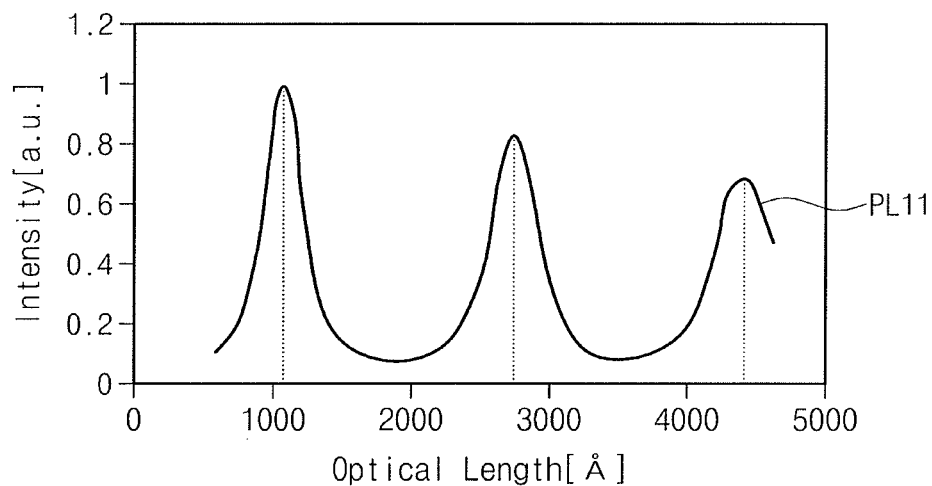
FIG. 2A to 2C illustrate graphs showing changes in intensity of different light emitting layers depending on changes in optical length.
Figure 2B:
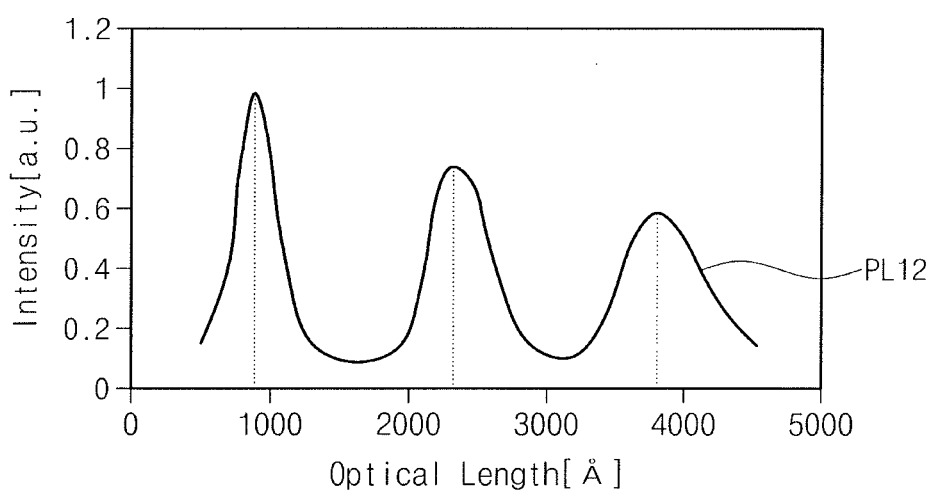
Figure 2C:
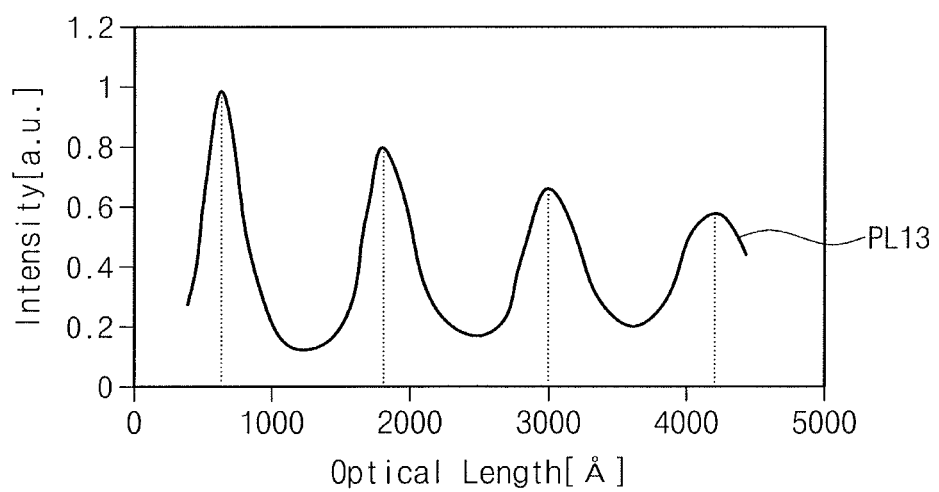

FIG. 2A to 2C are graphs showing changes in intensity of different light emitting layers depending on changes in optical length. For convenience of illustration, changes in intensity of each of light emitting layers depending on first optical length OL (see FIG. 1) are compared and shown. Hereinafter, the first optical length OL is examined with reference to FIG. 2A to 2C.

A first graph PL11 in FIG. 2A shows changes in intensity of light having a relatively long wavelength range. In the present embodiment, the first graph PL11 illustratively shows changes in intensity of red light.

A second graph PL12 in FIG. 2B shows changes in intensity of light having a relatively middle wavelength range. In the present embodiment, the second graph PL12 shows changes in intensity of green light.

A third graph PL13 in FIG. 2C shows changes in intensity of light having a relatively short wavelength range. In the present embodiment, the third graph PL13 shows changes in intensity of blue light.

The third graph PL13 may substantially correspond to changes in intensity depending on optical length of the first light generated by the first light emitting layer EML1 (see FIG. 1). Combination of the first graph PL11 and the second graph PL12 may substantially correspond to changes in intensity depending on optical length of the second light generated by the second light emitting layer EML2 (see FIG. 1).

Referring to FIG. 2A to 2C, light emitted from each light emitting layer has peak intensity at an interval of a certain length. Light tends to periodically produce resonance depending on the first optical length. The peak intensity corresponds to the resonant state of each light. Therefore, when a length having peak intensity is defined as the first optical length OL, high light extraction efficiency of the light may be achieved.

In the present embodiment, the first optical length OL may be established based on blue light. As the wavelength range is shorter, optical attenuation of blue light is relatively higher, e.g., lowering light efficiency thereof. Thus, the organic light emitting diode according to an embodiment establishes the first optical length OL based on the first light having relatively low light efficiency, e.g., blue light.

The first optical length at which each light emitting layer has peak intensity is different for the different colors. In particular, as can be seen in FIGS. 2A and 2B, while 1000 Å may be a good first optical length for red and green light, as can be seen in FIG. 2C, it is a very poor one for blue light. Thus, a single first optical length where all of light emitting layers have peak intensity is difficult to establish. However, as shown in FIG. 2A to 2C, as resonant order increases, differences in intensity between the first and second graphs PL11, PL12 and third graph PL13 decrease. As the resonant order increases, light intensity matching of light emitting layers having different color may relatively be facilitated.

As the resonant order increases, the first optical length OL increases. Consequently, the thickness of the organic light emitting diode is increased. As the thickness increases, the driving voltage of the diode may increase so that the driving property may be declined.

The first optical length OL may be established as the fourth resonant distance of the first light having blue color. Referring to the third graph PL13, the first optical length OL may be about 4000 Å. By designing the first optical length OL based on blue color light having relatively low light efficiency according to an embodiment, light intensity of blue color light may be increased. As can be seen in FIGS. 2A and 2B, this value is near the third resonant distance for the red and green light. Therefore, the problem in that the thickness of the organic light emitting diode getting thicker may be solved and intensity of blue color light may be maximally achieved.

Figure 3A:
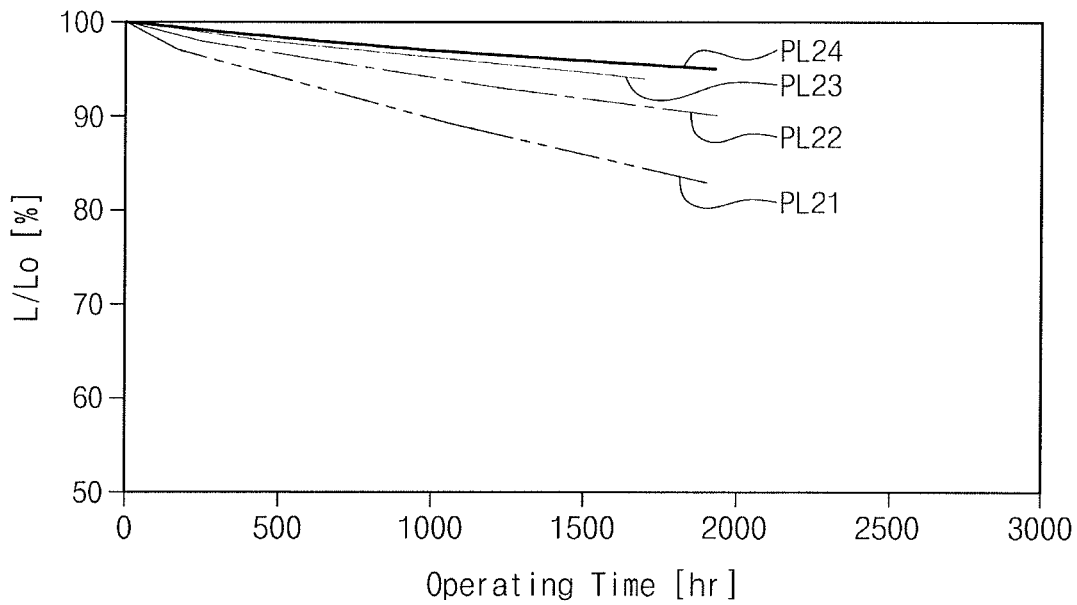
FIG. 3A illustrates changes in life of some organic light emitting diodes according to an embodiment.
Figure 3B:
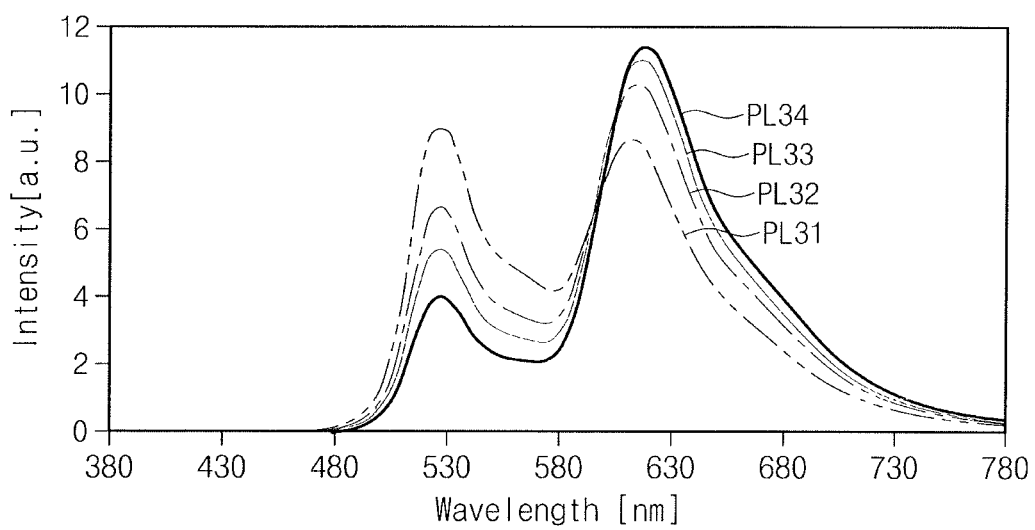
FIG. 3B illustrates changes in intensity of some organic light emitting diodes according to an embodiment.
Figure 4A:
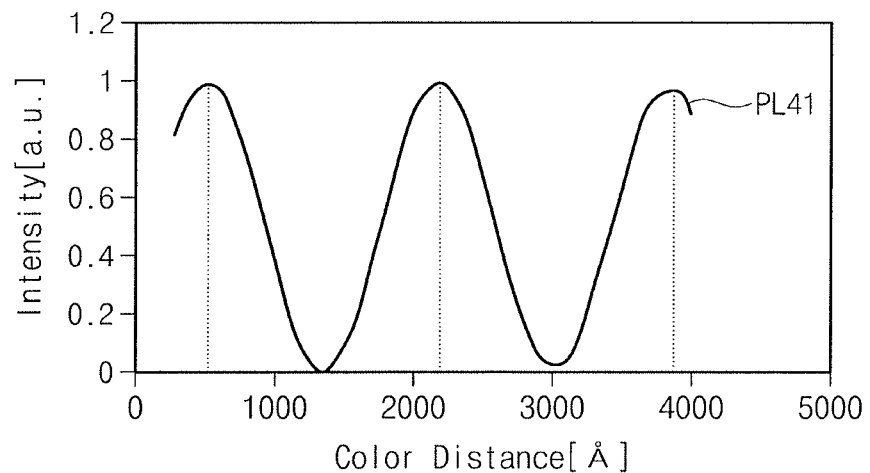
FIG. 4A to 4C illustrate graphs showing changes in intensity of different light emitting layers depending on changes in color distance.
Figure 4B:
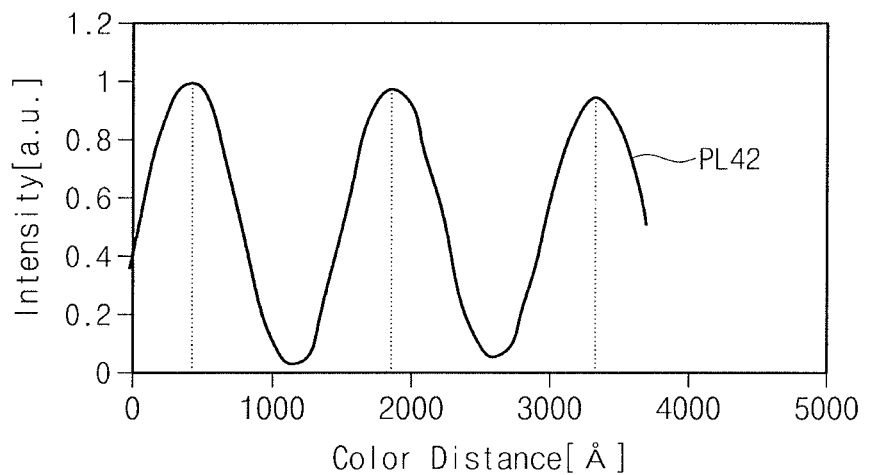
Figure 4C:
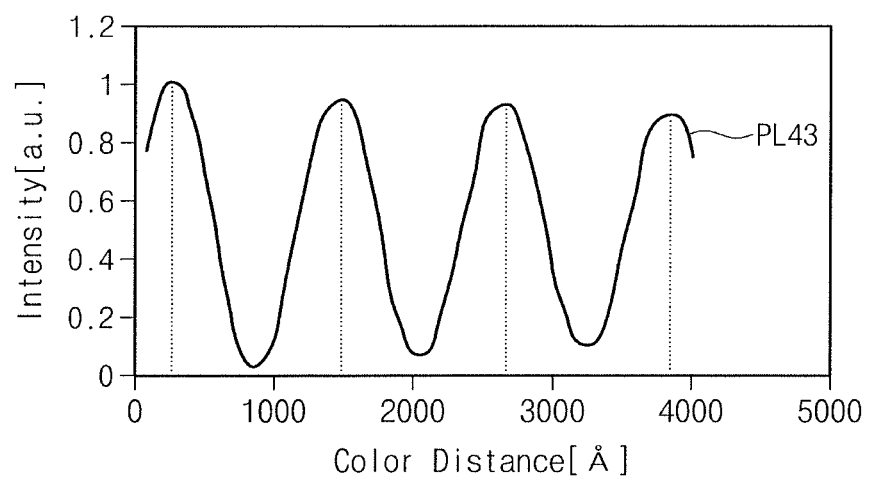

FIG. 3A shows changes in life of some organic light emitting diodes according to an embodiment. FIG. 3B shows changes in intensity of some organic light emitting diodes according to an embodiment. FIG. 4A to 4C are graphs showing changes in intensity of different light emitting layers depending on changes in the second optical length.

For convenience of illustration, FIGS. 3A and 3B are based on the second light emitting layer, e.g., the layer that emits yellow light. For convenience of illustration, in FIG. 4A to 4C, changes in intensity of each light emitting layer depending on the second optical length CD1, CD2 are compared and shown. The second optical length CD corresponds to the second optical lengths CD1, CD2 shown in FIG. 1. Hereinafter, referring to FIGS. 3A to 4C, the second optical length CD 1, 2 is examined.

First graphs PL21, PL31 as shown in FIGS. 3A and 3B show an embodiment in which the doping concentration of red color is 1%. Second graphs PL22, PL32 show an embodiment in which the doping concentration of red color is 2%. Third graphs PL23, PL33 show an embodiment in which the doping concentration of red color is 3%. Fourth graphs PL24, PL34 show an embodiment in which the doping concentration of red color is 4%. Each of the embodiments illustrated in FIGS. 3A and 3B only differs in terms of the doping concentration of red color, while the doping concentration of green color is constantly maintained at 6%.

FIG. 3A shows a brightness reduction rate (L/Lo, %) depending on operating time (hr). The brightness reduction rate depending on operating time may substantially correlate with life of the diode. As shown in FIG. 3A, as the doping concentration of red color increases, life of the diode tends to increase. In terms of the first to fourth graphs PL21, PL22, PL23, PL24, except the embodiment corresponding to the third graph PL23 having relatively short operating time, all embodiments shows operation for about 2000 hours (hr).

The embodiment corresponding to the fourth graph PL24 shows the least brightness reduction rate for the same operating time. Consequently, increasing the doping concentration of red color may increase life of the diode. In particular, as the doping concentration increases, the charge transfer rate in the light emitting layer tends to increase. Thus, by increasing the doping concentration of red color, charge accumulation in the red light emitting layer is reduced and, therefore, life of the diode may be enhanced.

FIG. 3B shows changes in intensity (a.u.) of light depending on wavelength (nm). Referring to the first to fourth graphs PL31, PL32, PL33, PL34 in FIG. 3B, as the doping concentration of red color increases, intensity of light having a wavelength of about 630 nm, which is in the red wavelength range, is increases, while intensity of light having a wavelength of about 530 nm, which is a green wavelength range, decreases.

When the second light generated by the second light emitting layer EML2 (see FIG. 1) has color in which red color and green color are combined, as the doping concentration of red color of the second light emitting layer EML2 increase, the second light has color shifted to the red wavelength range. Consequently, color purity of light generated by the diode may be affected.

Thus, the second optical length CD2 corresponding to the second light emitting layer EML2 according to an embodiment may be established based on green light. By controlling the second optical length to correspond to the resonant distance of green color, the spectrum of the second light, which is shifted to the red wavelength range due to increase in the red doping concentration, may be shifted to green wavelength range.

Specifically, referring to FIG. 4A, a first graph PL41 shows changes in intensity of light having a relatively long wavelength range, e.g., red light. A second graph PL42 in FIG. 4B shows changes in intensity of light having a relatively middle wavelength range, e.g., green light.

A third graph PL43 in FIG. 4C shows changes in intensity of light having a relatively short wavelength range. In the present embodiment, the third graph PL43 shows changes in intensity of blue light.

The third graph PL43 may substantially correspond to changes in intensity of the first light generated by the first light emitting layer EML1 depending on the second optical length. Combination of the first graph PL41 and the second graph PL42 may substantially correspond to changes in intensity of the second light generated by the second light emitting layer EML2 depending on the second optical length.

Referring to FIG. 4A to 4C, by controlling the second optical length, a resonant distance having peak intensity without difference in extent of intensity may be designed. As described above, since the first optical length OL (see FIG. 1) is established as about 4000 Å, the second optical length may substantially be determined in the range of about 4000 Å or less.

Referring to the first and second graphs PL41, PL42 in FIGS. 4A and 4B, the second optical length (color distance) of each of red optical length or green optical length may have a resonant distance in an order of 3 or less in the range of about 4000 Å or less. Referring to the third graph PL43 of FIG. 4C, the second optical length of blue color light may have a resonant distance in an order of 4 or less in the range of about 4000 Å or less.

Since the second optical length is a distance between the light emitting layer and the first electrode layer, the first optical length OL and the second optical length are measured at a different base point. Thus, the second optical length may be independently established without influence of the first optical length OL except for limitation of upper limit, and may be different in each of different light emitting layers.

Referring to the first graph PL41 in FIG. 4A and second graph PL42 in FIG. 4B, light intensity of red color in the second resonant length or third resonant length of green color light is decreased to 0.5 or less. When the second optical length of the second light emitting layer is established as about 1900 Å, which is a second resonant distance of green color light, or about 3350 Å, which is a third resonant distance of green color light, light generated by the organic light emitting diode is prevented from being shifted to red color while maintaining high red doping concentration. For example, the second optical length CD2 corresponding to the second light emitting layer EML2 may be about 1700 Å to about 2100 Å or about 3100 Å to about 3500 Å.

Referring to the first to third graphs PL41, PL42, PL43 in FIG. 4A to 4C, light intensity of blue color, which has relatively low light efficiency, is achieved through the first optical length OL as described above, and light intensities of red color and green color may be achieved through control of the second optical length.

According to an embodiment, the intensity of light of color, which is difficult to achieve through the first optical length OL alone, is complemented through control of the second optical length, and thus light intensity of all color may be evenly maintained. Consequently, color purity of the organic light emitting diode may be enhanced.

However, the above features are illustrative, and the second optical length CD2 corresponding to the second light emitting layer EML2 may be controlled based on yellow color light having a spectrum in which the first graph PL41 and the second graph PL42 are combined. The second optical length may be variously defined for each light emitting layer, and not limited to any one embodiment.

According to an embodiment, light efficiency of the organic light emitting diode may be achieved by increasing light efficiency of blue color through control of the first optical length OL, and color purity of the organic light emitting diode may be enhanced by controlling the second optical length. The organic light emitting diode according to an embodiment may have enhanced light efficiency, generate white light having high purity, and have enhanced life without addition of a new functional layer or modification of materials.

Figure 5:
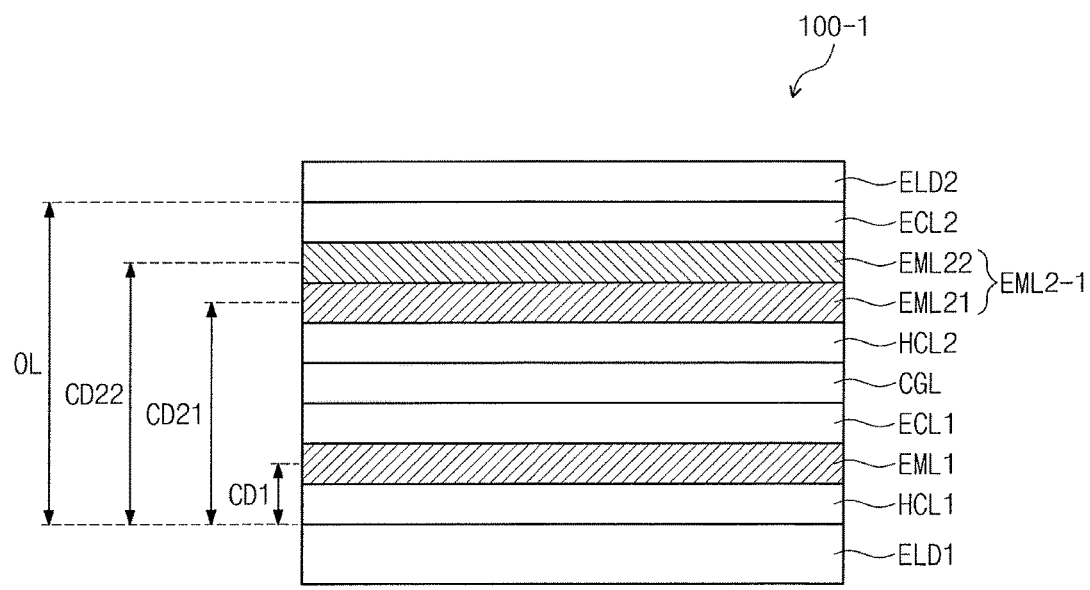
FIG. 5 illustrates a cross sectional view schematically showing an organic light emitting diode according to an embodiment.

FIG. 5 is a cross sectional view schematically showing an organic light emitting diode according to an embodiment. For elements the same as the elements described in FIGS. 1 to 4c, same reference number is used, and redundant description is not provided.

As shown in FIG. 5, an organic light emitting diode 100-1 may include a second light emitting layer EML2-1 divided into a plurality of sub light emitting layers EML21, EML22. The sub light emitting layers EML21, EML22 respectively generate light having different color.

The sub light emitting layers EML21, EML22 include a first sub light emitting layers EML21 and a second sub light emitting layer EML22. The first and second sub light emitting layers EML21, EML22 are separated and independently emit light, which is emitted as light having a single mixed color in view of the second light emitting layer EML2-1.

The first sub light emitting layers EML21 may generate a third light and the second sub light emitting layer EML22 may generate a fourth light. The third and fourth light may be mixed to generate a second light. For example, when the second light has yellow color, the third light may be red light and the fourth light may be green light.

In that case, second optical lengths CD21, CD22 for each of the first and second sub light emitting layers EML21, EML22 may be established. The second optical lengths CD21, CD22 may be established as distances from the first electrode layer ELD1 to the light emitting centers of each of the first and second sub light emitting layers EML21, EML22.

However, these features are illustrative, and the third and fourth light may be substituted each other. Additionally, the second light emitting layer EML2-1 may include more sub light emitting layers. The second light emitting layer EML2-1 may generate light having color corresponding to combination of colors generated by each of sub light emitting layers.

The organic light emitting diode 100-1 according to an embodiment may control the second optical length CD21, CD22 of each of light emitting centers for a light emitting layer which is separated and emits light. According to an embodiment, detailed designing for enhancement of color purity of an organic light emitting diode is available.

Figure 6:
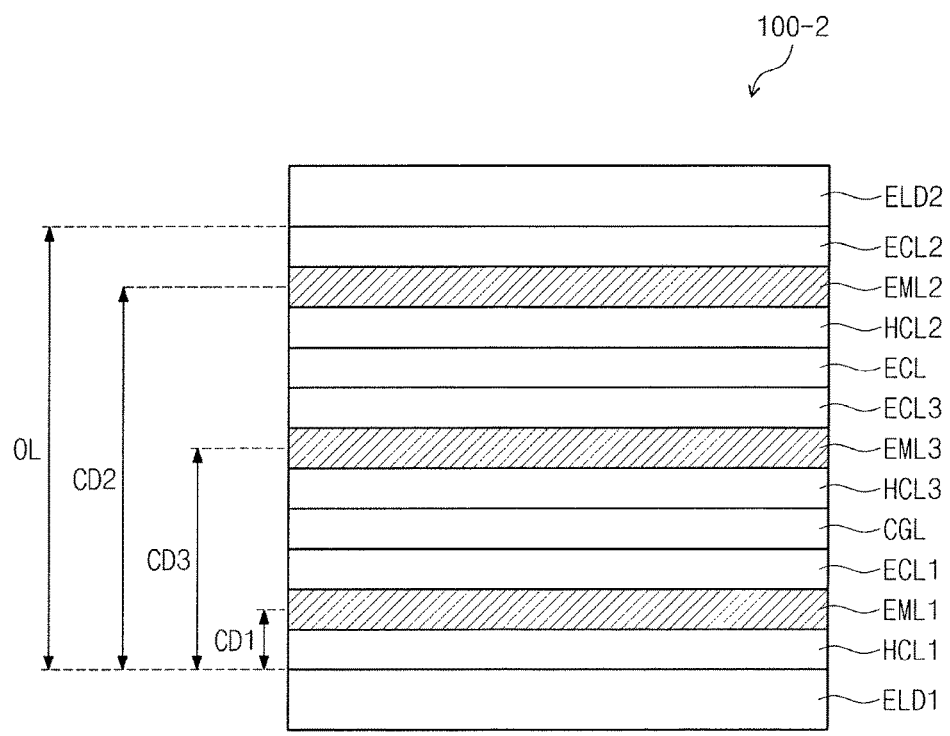
FIG. 6 illustrates a cross sectional view schematically showing an organic light emitting diode according to an embodiment.
Figure 7:
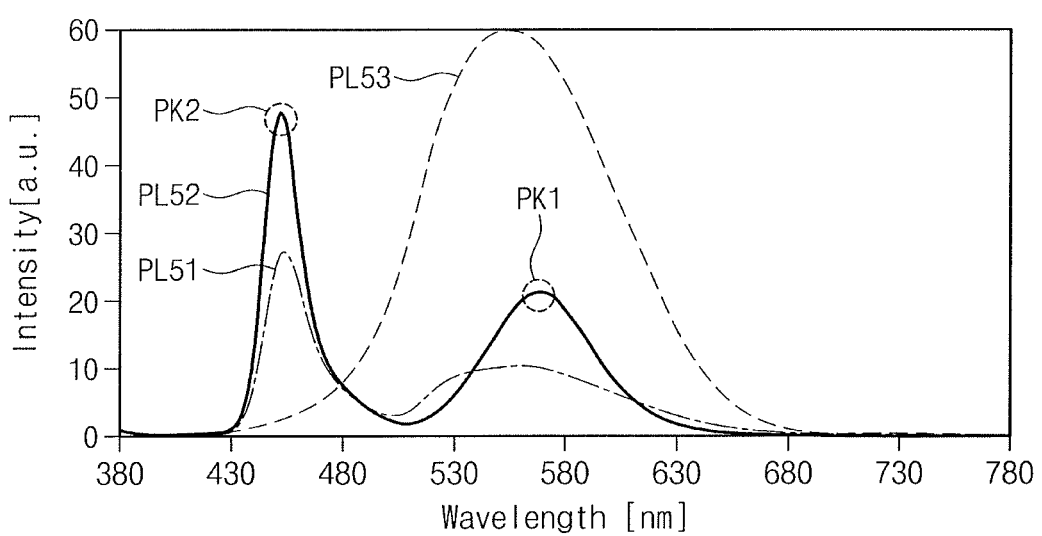
FIG. 7 illustrates a graph showing a light intensity of an organic light emitting diode according to an embodiment.

FIG. 6 is a cross sectional view schematically showing an organic light emitting diode according to an embodiment. FIG. 7 is a graph showing light intensity of an organic light emitting diode according to an embodiment. Hereinafter, referring to FIGS. 6 and 7, the organic light emitting diode according to an embodiment is examined. For elements the same as the elements depicted in FIGS. 1 to 5, the same reference number is used, and redundant explanation is not provided.

As shown in FIG. 6, an organic light emitting diode 100-2 may further include a plurality of charge generating layers CGL1, CGL2, and a third light emitting layer EML3. The charge generating layers CGL1, CGL2 may include a first charge generating layer CGL1, and a second charge generating layer CGL2.

The third light emitting layer EML3 may be between the first light emitting layer EML1 and the second light emitting layer EML2. The first light emitting layer EML1 and the second light emitting layer EML2 may respectively correspond to the first and second light emitting layers depicted in FIG. 1.

The wavelength range of light generated by the third light emitting layer EML3 may partially overlap with the wavelength range of the first light generated by the first light emitting layer EML1. For example, light generated by the third light emitting layer EML3 and the first light emitting layer EML1 may both be blue, but may have different wavelengths as well as overlapping wavelengths.

Light generated by the third light emitting layer EML3 and the first and second light may be mixed to generate light having white color. However, these features are illustrative, and the third light emitting layer EML3 may generate light having various color, as long as the light may be mixed with the first and second light to generate white light, and is not limited to any one embodiment.

The first charge generating layer CGL1 is between the first light emitting layer EML1 and the third light emitting layer EML3. Electrons generated in the first charge generating layer CGL1 reach the first light emitting layer EML1 via the first electron control layer ECL1, and holes generated in the first charge generating layer CGL1 reach the third light emitting layer EML3 via the third hole control layer HCL3.

The second charge generating layer CGL2 is between the second light emitting layer EML2 and the third light emitting layer EML3. Holes generated in the second charge generating layer CGL2 reach the second light emitting layer EML2 via the second hole control layer HCL2 and electrons generated in the second charge generating layer CGL2 reach the third light emitting layer EML3 via the third electron control layer ECL3. Detailed description of these elements corresponds to the layers described in FIGS. 1 to 4, and is not provided.

A second optical length CD3 may correspond to the third light emitting layer EML3. The second optical length CD3 where the light emitting center of the third light emitting layer EML3 is spaced apart from the first electrode layer ELD1 may be controlled as the first light emitting layer EML1 and the second light emitting layer EML2 as described above. When the third light emitting layer EML3 substantially generates light of color corresponding to the first light emitting layer EML1, the second optical length CD3 corresponding to the third light emitting layer EML3 may be established based on the third graph PL43 in FIG. 4C.

When the second optical length CD1 corresponding to the first light emitting layer EML1 is established as the first resonant distance of the first light, the second optical length CD3 corresponding to the third light emitting layer EML3 may be established as any one of a second, third, or fourth resonant distance of the first light.

Referring to FIG. 7, a first graph PL51 shows an embodiment in which the second optical length CD1 corresponding to the first light emitting layer EML1 is the first resonant distance; the second optical length CD2 corresponding to the second light emitting layer EML2 is the third resonant distance; and the second optical length CD3 corresponding to the third light emitting layer EML3 is the third resonant distance. A second graph PL52 shows an embodiment in which the second optical length CD1 corresponding to the first light emitting layer EML1 is the second resonant distance; the second optical length CD2 corresponding to the second light emitting layer EML2 is the second resonant distance; and the second optical length CD3 corresponding to the third light emitting layer EML3 is the third resonant distance. A third graph PL53 shows an intensity plot of natural light in accordance with a wavelength. The third graph PL53 may show a plot of white light.

As shown in FIG. 7, as compared with the first graph PL51, the second graph PL52 has a higher intensity at about 450 nm, which is a wavelength range of light having blue color, and about 580 nm, which is a wavelength range of light having green color. The second graph PL52 includes a first peak PK1 and second peak PK2 having significantly increased intensity than the first graph PL51.

The first peak PK1 appears at a wavelength range of about 570 nm which is a wavelength range of green color. Referring to FIG. 4 described above, when the second optical length CD2 corresponding to the second light emitting layer EML2 is established as the third resonant distance from the second resonant distance of light having green color, light of red color is relatively reduced and light intensity of green color appears to be increased.

The second peak PK2 has a second peak PK2 in a wavelength range of about 450 nm which is a wavelength range of blue color. Referring to FIG. 4 described above, the second optical length where light having blue color produces the first resonance may be relatively short length, i.e. about 300 Å.

When the second optical length CD1 corresponding to the first light emitting layer EML1 is established as the first resonant distance, the distance between the first electrode layer ELD1 and the first light emitting layer EML1 decreases, so that plasmon effect may be exhibited. Since the plasmon effect makes extraction of light generated in the first light emitting layer EML1 via the second electrode layer ELD2 more difficult, light emitting efficiency may be decrease.

Therefore, the effect of enhancing light intensity of blue color is shown in the second graph PL52 in which the second optical length CD1 corresponding to the first light emitting layer EML1 is established as the second resonant distance which is relatively longer than the first resonant distance of the first graph PL51.

The organic light emitting diode according to an embodiment may be designed such that the organic light emitting diode has the first optical length OL of the fourth resonant distance of light having blue color; a second optical length CD1 corresponding to the first light emitting layer EML1 has the second resonant distance of light having blue color; the second optical length CD2 corresponding to the second light emitting layer EML2 has the third resonant distance of light having blue color; and the second optical length CD3 of the third light emitting layer EML3 has the third resonant distance of light having green color.

For example, the first optical length OL may be established as about 4200 Å, the second optical length CD1 corresponding to the first light emitting layer EML1 may be established as about 1500 Å, the second optical length CD2 corresponding to the second light emitting layer EML2 may be established about 2650 Å, and the second optical length CD3 corresponding to the third light emitting layer EML3 may be established as about 3350 Å.

The organic light emitting diode according to an embodiment may simultaneously achieve enhancement in color purity and life without modification of materials or addition of new layers by controlling the first optical length OL and each of the second optical lengths CD1, CD2, CD3 of the light emitting layer. Consequently, the process may become simple and processing cost may be reduced.

The organic light emitting diode may have enhanced light emitting efficiency and enhanced color purity by controlling the distance between layers. By controlling the distance between electrode layers included in the organic light emitting diode, efficiency of blue color light, which largely affects light efficiency, may be increased. Also, by controlling separation distance of light emitting layers from electrode layers, balance of color may be achieved and thus color purity may be enhanced.

According to embodiments, without adding new materials or new functional layers, the organic light emitting diode having enhanced properties may be provided. In particular, a white organic light emitting diode having enhanced light emitting efficiency, enhanced color purity, and enhanced life may be realized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode, comprising:
    a first electrode layer;
    a second electrode layer opposing the first electrode layer, the second electrode layer apart from the first electrode layer by an optical length;
    a first light emitting layer between the first and second electrode layers, the first light emitting layer to generate a first light having a first wavelength;
    a second light emitting layer between the first light emitting layer and the second electrode layer, the second light emitting layer to generate a second light having a second wavelength, longer than the first wavelength; and
    a charge generating layer between the first and second light emitting layers, wherein
    the first and second lights are emitted to the outside through the second electrode layer,
    the optical length is defined as a minimal distance from an interface between the first electrode layer and a layer in contact with the first electrode layer to an interface between the second electrode layer and a layer in contact with the second electrode layer, and
    the optical length between the first and second electrode layers is a fourth resonant distance of the first light.

2. The organic light emitting diode as claimed in claim 1, wherein:
    the first electrode layer is reflective, and
    the second electrode layer is transflective.

3. The organic light emitting diode as claimed in claim 2, wherein:
    the first electrode layer includes a top surface facing the second electrode layer and a bottom surface opposite the top surface;
    the second electrode layer includes a bottom surface facing the first electrode layer and a top surface opposite the bottom surface; and
    the optical length between the first and second electrode layers is a length from the top surface of the first electrode layer to the bottom surface of the second electrode layer.

4. The organic light emitting diode as claimed in claim 1, wherein the fourth resonant distance of the first light is between about 4000 Å to about 4400 Å.

5. The organic light emitting diode as claimed in claim 1, wherein the second and first light are mixed to generate white light.

6. The organic light emitting diode as claimed in claim 5, wherein the first wavelength is in the range of about 450 nm to about 595 nm, and the second wavelength is in the range of about 570 nm to about 590 nm.

7. The organic light emitting diode as claimed in claim 6, wherein the red dopant doping concentration of the second light emitting layer is about 4% or more.

8. The organic light emitting diode as claimed in claim 6, wherein the optical length between the second light emitting layer and the first electrode layer is substantially the same as a second resonant distance or a third resonant distance of the second light.

9. The organic light emitting diode as claimed in claim 8, wherein:
    the optical length between the second light emitting layer and the first electrode layer is defined as a distance from the first electrode layer to a light emitting center of the second light emitting layer; and
    the light emitting center is defined at a location spaced apart from the surface of the second light emitting layer by ½ of the thickness of the second light emitting layer.

10. The organic light emitting diode as claimed in claim 6, wherein the second light emitting layer includes:
    a first sub light emitting layer to generate a third light having a third wavelength; and
    a second sub light emitting layer on the first sub light emitting layer, the second sub light emitting layer to generate a fourth light having a fourth wavelength different from the third wavelength, wherein
    the third light and the fourth light are mixed to generate the second light.

11. The organic light emitting diode as claimed in claim 10, wherein a light center of the second light emitting layer is defined at the interface between the first and second sub light emitting layers.

12. The organic light emitting diode as claimed in claim 10, wherein the third wavelength is in the range from about 620 nm to about 750 nm and the fourth wavelength is in the range from about 495 nm to about 570 nm.

13. The organic light emitting diode as claimed in claim 10, wherein the optical length between the second light emitting layer and the first electrode layer is substantially the same as a second resonant distance or a third resonant distance of the fourth light.

14. The organic light emitting diode as claimed in claim 13, wherein the second resonant distance of the fourth light is about 1700 Å to about 2100 Å and the third resonant distance of the fourth light is about 3100 Å to about 3600 Å.

15. An organic light emitting diode, comprising:
- a first electrode layer;
- a second electrode layer opposing the first electrode layer;
- a first light emitting layer between the first and second electrode layers, the first light emitting layer to generate a first light having a first wavelength range;
- a second light emitting layer between the first light emitting layer and the second electrode layer, the second light emitting layer to generate a second light having a second wavelength range, longer than the first wavelength range;
- a third light emitting layer between the first and second light emitting layers;
- a first electric charge generating layer between the first and third light emitting layers; and
- a second charge generating layer between the second and third light emitting layer, wherein
- the first to third lights are emitted to the outside through the second electrode layer, and
- an optical length between the first and second electrode layers is a fourth resonant distance of the first light.

16. The organic light emitting diode as claimed in claim 15, wherein the third light emitting layer is to generate the third light having a wavelength range of about 450 nm to about 595 nm.

17. The organic light emitting diode as claimed in claim 16, wherein the optical length between the first light emitting layer and the first electrode layer is substantially the same as a second resonant distance of the third light.

18. The organic light emitting diode as claimed in claim 16, wherein the light emitting center of the first light emitting layer is spaced apart from the first electrode layer by about 1300 Å to about 1700 Å.

\* \* \* \* \*